United States Patent [19]

Koinuma et al.

[11] Patent Number: 4,902,671

[45] Date of Patent: Feb. 20, 1990

[54] MANUFACTURING METHOD OF CONDUCTIVE OR SUPERCONDUCTIVE THIN FILM

[75] Inventors: Hideomi Koinuma; Kazuo Fueki; Masashi Kawasaki; Shunroh Nagata, all of Tokyo, Japan

[73] Assignee: Kawatetsu Mining Co. Ltd., Tokyo, Japan

[21] Appl. No.: 159,987

[22] Filed: Feb. 24, 1988

[30] Foreign Application Priority Data

Feb. 24, 1987 [JP] Japan .................................. 62-39182

[51] Int. Cl.⁴ ............................................. H01L 39/00
[52] U.S. Cl. .................................... 505/1; 204/192.15; 204/192.17; 204/192.24; 505/816; 505/731
[58] Field of Search .................. 204/192.24, 192.15, 204/192.17, 192.24; 505/816, 1

[56] References Cited

U.S. PATENT DOCUMENTS 4,316,785  2/1982  Suzuki et al. .................... 204/192.24

FOREIGN PATENT DOCUMENTS 60-96599  5/1985  Japan ................................ 204/192.24

Primary Examiner—Aaron Weisstuch
Attorney, Agent, or Firm—Cushman, Darby and Cushman

[57] ABSTRACT

The present invention provides a manufacturing method of a conductive or superconductive thin film of mixed oxide as an easier way to apply the mixed oxide type superconductive materials to electronic devices, etc. The manufacturing method of the present invention comprises using a mixed oxide composition showing conductivity or superconductivity as a target material and sputtering it onto a substrate to form a thin film. Examples of the mixed oxide compositions showing conductivity or superconductivity and to be used as the target material in the present invention are mixed oxides consisting of lanthanoid, alkali earth metal and copper as main components, particularly, a mixed oxide consisting essentially of La-Sr-Cu-O, La-Ba-Cu-O, La-Ca-Cu-O etc. or mixtures thereof, materials containing a small quantity of other metal oxide(s), or mixed oxides mainly consisting of Yb-Ba-Cu-O, Er-Ba-Cu-O, Ho-Ba-Cu-O, Tm-Ba-Cu-O or mixtures thereof.

5 Claims, 4 Drawing Sheets

MANUFACTURING METHOD OF CONDUCTIVE OR SUPERCONDUCTIVE THIN FILM

FIELD OF THE INVENTION

The present invention relates to a manufacturing method of a conductive or superconductive thin film, which is expected to be applied to a Josephson element or optical sensor etc.

DESCRIPTION OF THE ART

A conductive material is expected to be applied to a varistor or a sensor etc.

On the other hand, a superconductive material having the properties of no electric resistance, Josephson effect, perfect diamagnetic property etc. is expected to be used as a coil type conducting wire with no electric loss, a Josephson element or a magnetic shielding material Heretofore, Nb-Sn alloy (critical temperature of superconductivity: $T_c=18$ K), Nb-Ge alloy ($T_c=23$ K) or the like has been known as a superconductive material.

Recently, mixed oxides, essentially consisting of lanthanum, alkali-earth metal and copper, practically of La-Sr-Cu-O, La-Ba-Cu-O or La-Ca-Cu-O systems have been found to show superconductivity at higher temperatures (in the case of the mixed oxide containing Sr or Ba as the alkali-earth metal, the $T_c$ is 30 K or higher) than that of the superconductive material already known, and such mixed oxide materials have attracted the attention of many researchers as superconductive materials which may be used under cooling with liquefied hydrogen (boiling point: 20.3 K) or liquified neon (boiling point: 27.1 K).

Furthermore, mixed oxides mainly consisting of lanthanoid metals, barium or copper, practically of Yb-Ba-Cu-O, Er-Ba-Cu-O, Ho-Ba-Cu-O, Tm-Ba-Cu-O or mixed systems were found to be superconductive at higher temperature (80 K or higher) than that of liquified nitrogen (boiling point: 77.3 K), so that mixed oxides have abruptly drawn more attention.

However, such mixed oxides consist of a kind of ceramic and have required a sinter heat-treatment at 800° C. or higher temperature after compression molding of powder-like raw materials, by which such superconductive materials have been prevented from the abovementioned practical uses.

The present invention provides a manufacturing method of a conductive or superconductive thin film of mixed oxide which is an easier way to effect the application of the mixed oxide type superconductive materials to electronic devices etc.

DETAILED DESCRIPTION OF THE PREFERRED EMBODIMENTS

Figure 1:
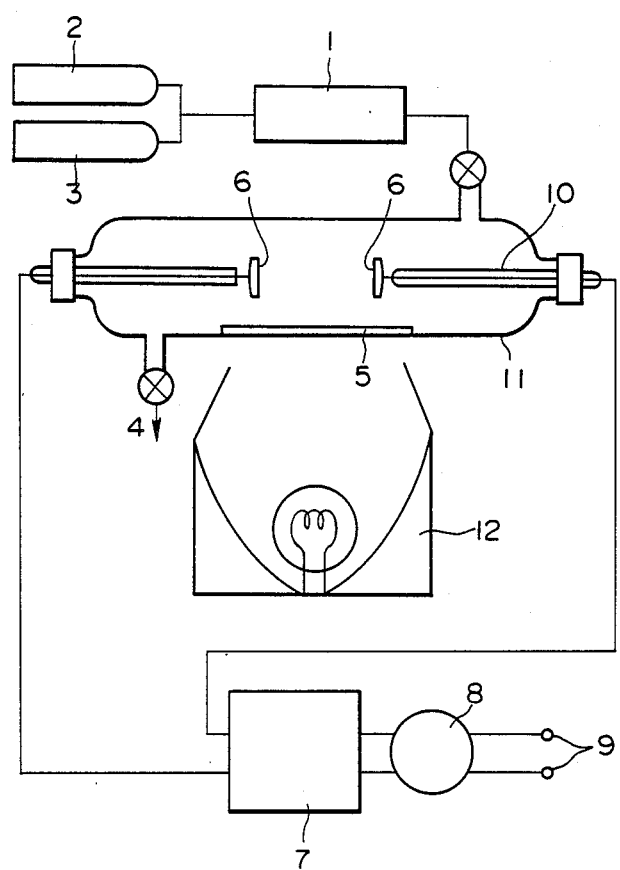
FIG. 1 illustrates an exemplary sputtering apparatus for practice of the present invention.

The manufacturing method of a conductive or superconductive thin film of the present invention comprises using a mixed oxide composition showing conductivity or superconductivity as a target material and sputtering it on a substrate to form a thin film.

Further, when the thin film is irradiated with ultraviolet light or vacuum ultraviolet light, the conductivity or the superconductivity of the thin film is improved.

Furthermore, when the sputtering of the target material on the substrate is carried out under irradiation of ultraviolet or vacuum ultraviolet light, the conductive or superconductive thin film can be formed at a lower temperature than the case without the radiation.

That is, the ultraviolet or vacuum ultraviolet light within the wave length range of 100–400 nm excites the oxygen atoms in the atmosphere to ozone or oxygen radicals which react with the particulate mixed oxide in the gas phase and on the surface of the substrate to increase the oxygen atoms incorporated in the conductive or superconductive thin film.

The example of the mixed oxide composition showing conductivity or superconductivity and to be used as the target material in the present invention is a mixed oxide consisting of lanthanoid, alkali earth metal and copper as main components, particularly, a mixed oxide consisting essentially of La-Sr-Cu-O, La-Ba-Cu-O, La-Ca-Cu-O etc. or mixtures thereof, the previously mentioned materials containing a small quantity of other metal oxide(s), or a mixed oxide mainly consisting of Yb-Ba-Cu-O, Er-Ba-Cu-O, Ho-Ba-Cu-O, Tm-Ba-Cu-O or mixtures thereof.

In the case of the aforementioned mixed oxide mainly consisting of lanthanoid, alkali-earth metal and copper, a composition having a generaly formula of $(La_{1-x}M_x)_2CuO_{4-delta}$ (Here, M represents Ca, Sr or Ba, x represents 0.04–0.20, preferably 0.5–0.15, and 4-delta represents the atomic value of O atoms balancing the atomic value of the metallic components) and with $K_2NiF_4$ type crystal structure, or a composition having a general formula of $M'_{1-x}Ba_xCu_yO_3$-delta (Here, M' represents Yb, Er, Ho, Tm or a mixture of lanthanoids, x represents 0.9–0.5, preferably 0.8–0.6, y represents 0.8–1.2, preferably 1.0, and 3-delta represents the atomic value of O atoms balancing the atomic value of the metallic components) and with oxygen deficient perovskite type structure, has been known to show high critical temperature Tc (the temperature at which transition to superconductivity starts), can preferably be used as the target material.

Naturally, another mixed oxide composition other than the aforementioned composition which shows conductivity or superconductivity can be used as the target material in the present invention.

As the target material of the present invention, either a mixed oxide with the composition and the crystal structure showing conductivity or superconductivity itself or a mixed oxide with the same composition, but not yet showing conductivity or superconductivity may be used. A conductive or superconductive thin film may be formed from either by sputtering it onto a substrate and simultaneous or subsequent heat treating.

The mixed oxide composition can be used as the target material in a form of a powder or a sinter.

As to the preparation method of a sintered mixed oxide to be used as the target in the present invention, blending of powders of oxide or carbonate of respective components, coprecipitation, spray-drying etc. or other known synthetic method for a powder of mixed oxides may be employed as the first step, whereafter said powder of mixed oxide is calcined, for example, at a temperature above 450° C. for 1 hour or more, preferably at a temperature above 800° C. for 10 hours or more, then compressed to pellets with an appropriate size, and sintered at still higher temperature. Alternatively, said powder of mixed oxide may be placed on an appropriately shaped electrode to be used as the target.

The electric power source for the sputtering in the present invention can be selected from high frequency current, alternating current or direct current.

The sputtering gas atmosphere may be selected from oxygen, ozone, argon, other inert gas, a mixed gas or oxygen and inert gas, and a mixed gas of ozone and inert gas.

As the source of ultraviolet or vacuum ultraviolet light to be used for the excitation of the oxygen atoms, any source which radiates ultraviolet or vacuum ultraviolet light, for example, a deuterium lamp, a mercury lamp, or an excimer laser can be employed.

As a window to introduce the ultraviolet or vacuum ultraviolet light into the reaction tube of the sputtering apparatus, quartz or a transparent and heat-resistant ceramic such as magnesium fluoride or calcium fluoride may be employed.

Heat-treating of the thin film obtained by sputtering is performed to accelerate the crystallization of the mixed oxide composing the thin film. It is performed at 400°–1200° C., preferably at 500°–1000° C., because the crystallization would be slow at a temperature under 400° C., and the decomposition of the thin film would occur at a temperature above 1200° C.

Optimum heat treating time depends upon the treating temperature, but it may be extended for a longer time.

The heat-treating of the thin film may be performed simultaneously with the formation of the thin film through sputtering in a high temperature atmosphere, or may be performed after the formation of the thin film.

The substrate is selected from ceramic or metallic ones which withstand the heat-treating temperature.

The sputtering apparatus may be selected from those available in the commercial market.

In examples 1–10 described below, an apparatus shown in FIG. 1 was used, wherein 1 is a flow meter, 2 is an argon cylinder, 3 is an oxygen cylinder, 4 is a rotary pump and a diffusion pump, 5 is a substrate, 6 is a target, 7 is a high voltage transformer, 8 is a variable voltage regulator, 9 is a 100 volt alternating current source, 10 is an electrode, 11 is a reaction tube and 12 is an infrared lamp to heat the substrate (5).

EXAMPLE 1

Using the sputtering apparatus as shown in FIG. 1, equipped with targets composed of a mixed oxide with the formula of $(La_{0.9}Sr_{0.1})_2CuO_{4-delta}$, sputtering onto a zirconium oxide substrate was carried out under the conditions of reaction pressure 50 mTorr, alternating current (50 Hz) of 5400 V, in an atmosphere of Argon containing 5% oxygen, to obtain a thin film of said mixed oxide with a thickness of 1 micron. The thus obtained film was then heat treated in an electric furnace at 500° C. for 10 hours.

Figure 2:
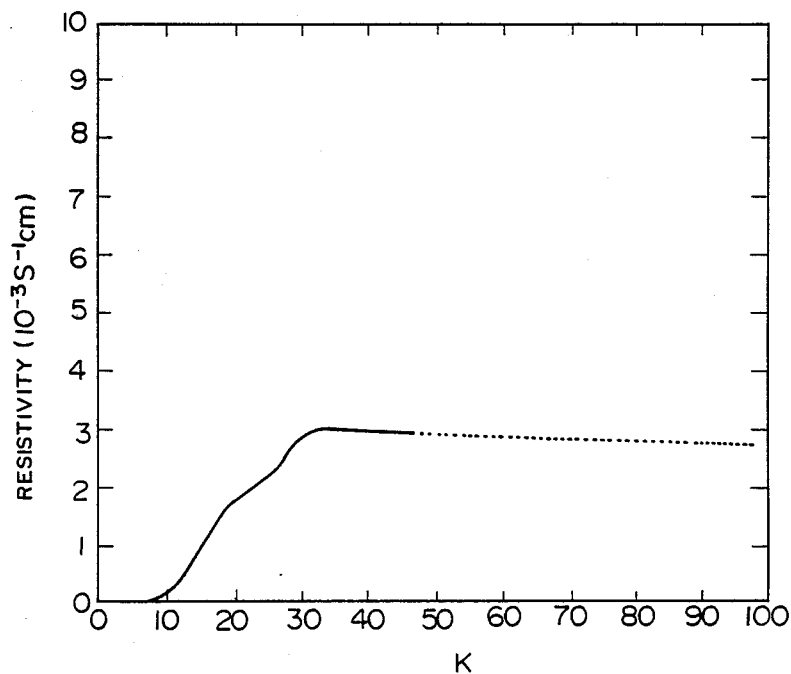
FIG. 2 illustrates the measured value of the resistivity of the thin film of Example 1 at low temperature, where the ordinate shows the resistivity ($10^{-3}S^{-1}$cm) and the abscissa shows absolute temperature (K).

The electric resistance of the thin film at low temperature was measured and it was found that the transition to the superconductive state started at a temperature of about 32 K as shown in FIG. 2, becoming superconductive below the limit of measurement at a temperature of about 10 K.

EXAMPLE 2

Using targets composed of a mixed oxide with the formula $(La_{0.9}Sr_{0.1})_2CuO_{4-delta}$, sputtering onto a "Corning 7059" substrate was carried out in the same manner as EXAMPLE 1 to obtain a thin film of said mixed oxide with a thickness of 1 micron and the thin film was heat-treated in the same manner as EXAMPLE 1.

The thus produced thin film started the transition to the superconductive state at a temperature of about 30 K.

EXAMPLE 3

Using targets composed of a mixed oxide with the formula of $(La_{0.9}Ca_{0.1})_2CuO_{4-delta}$, sputtering onto a sapphire substrate was carried out in the same manner as EXAMPLE 1 and a thin film of said mixed oxide with a thickness of 1 micron was obtained and the thin film was heat-treated in the same manner as EXAMPLE 1.

The thus produced film started the transition to the superconductive state at a temperature of about 15 K.

EXAMPLE 4

Using targets composed of a mixed oxide with the formula of $(La_{0.9}Sr_{0.05}Ba_{0.05})_2CuO_{4-delta}$, sputtering onto a magnesium oxide substrate was carried out in the same manner as in EXAMPLE 1 to obtain a thin film of said mixed oxide with a thickness of 1 micron and the thin film was heat-treated in the same manner as EXAMPLE 1.

The thus produced thin film started the transition to the superconductive state at a temperature of about 31 K.

EXAMPLE 5

Using targets composed of a mixed oxide with the formula of $(La_{0.85}Sr_{0.15})_2CuO_{4-delta}$, sputtering onto a "Corning 7059" substrate was carried out in the same manner as EXAMPLE 1 to obtain a thin film of said mixed oxide with a thickness of 1 micron.

The thus produced thin film showed a high conductivity of about $300 S \cdot cm^{-1}$, by measuring it at room temperature.

EXAMPLE 6

Using the sputtering apparatus as shown in FIG. 1, equipped with targets composed of a mixed oxide with the formula of $Yb_{0.3}Ba_{0.7}CuO_{3-delta}$, sputtering onto a zirconium oxide substrate was carried out under the conditions of reaction pressure of mTorr alternating current (50 Hz) of 9000 V, in an atmosphere or Argon containing 10% oxygen, and a thin film of said mixed oxide with a thickness of 1 micron was obtained.

The electric resistance of the thin film at low temperature was measured and it was found that the transition to the superconductive state started at a temperature of about 90 K, becoming superconductive below the limit of measurement at a temperature of about 65 K.

EXAMPLE 7

Using targets composed of a mixed oxide with the formula of $Er_{0.25}Ba_{0.75}CuO_{3-delta}$, sputtering onto a "Corning 7059" substrate was carried out in the same manner as EXAMPLE 6 and a thin film of said mixed oxide with a thickness of 1 micron was obtained. The thus obtained film was then heat-treated in an electric furnace at 550° C. for 2 hours.

The thus produced thin film started the transition to the superconductive state at a temperature of about 90 K.

EXAMPLE 8

Using targets composed of a mixed oxide with the formula of $Tm_{0.3}Ba_{0.7}CuO_{3-delta}$, sputtering onto a sapphire substrate was carried out in the same manner as EXAMPLE 6 and a thin film of said mixed oxide with a thickness of 1 micron was obtained and the thin film was heat-treated in the same manner as EXAMPLE 7.

The thus obtained film started the transition to the superconductive state at a temperature of about 95 K.

EXAMPLE 9

Using targets composed of a mixed oxide with the formula of $M_{0.3}Ba_{0.7}CuO_{3-delta}$, wherein M is a mixture of lanthanoids, sputtering onto a "Corning 7059" substrate was carried out in the same manner as EXAMPLE 6 and a thin film of said mixed oxide with a thickness of 1 micron was obtained. The thus obtained film was then heat-treated in an electric furnace in the same manner as EXAMPLE 7.

The thus produced thin film started the transition to the superconductive state at a temperature of about 93 K.

EXAMPLE 10

Using targets composed of a mixed oxide with the formula of $Yb_{0.25}Ba_{0.75}CuO_{3-delta}$, sputtering onto a "Corning 7059" substrate was carried out in the same manner as EXAMPLE 6 and a thin film of said mixed oxide with a thickness of 1 micron was obtained.

The thus produced thin film showed a high conductivity of about $500 S \cdot cm^{-1}$, by measuring it at room temperature.

EXAMPLE 11

Figure 3:
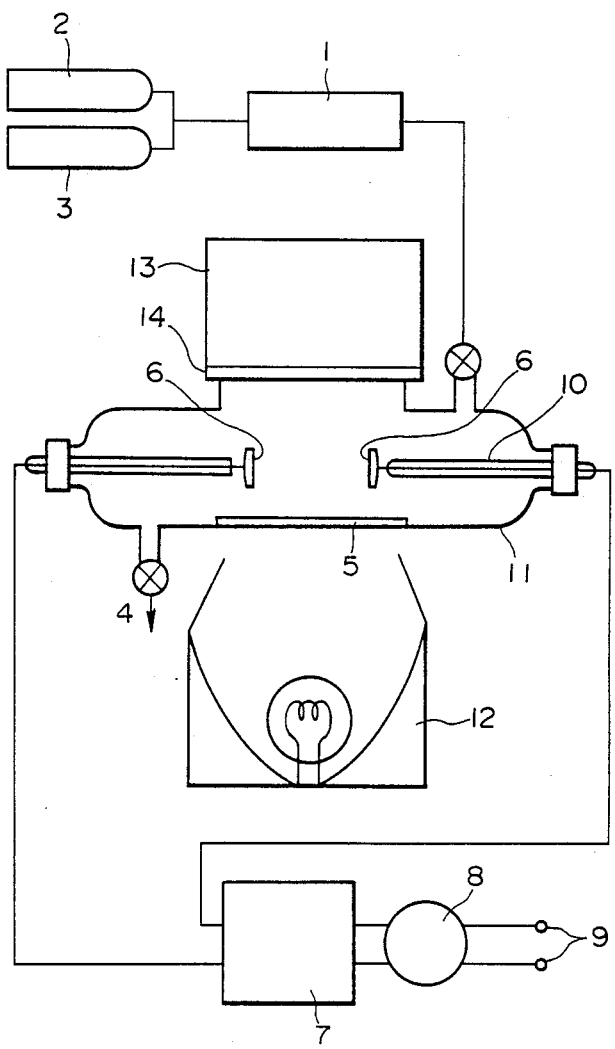
FIG. 3 illustrates an exemplary sputtering apparatus equipped with an ultraviolet or vacuum ultraviolet illumination source.

Using the sputtering apparatus as shown in FIG. 3, wherein 13 is a source of ultraviolet or vacuum ultraviolet light, and 14 is a window to admit the said light, and equipped with targets composed of a mixed oxide with the formula of $Yb_{1.0}Ba_{2.0}Cu_{3.6}O_x$ (x=6-8), sputtering onto a strontium titanate substrate was carried out under the conditions of reaction pressure of 100 mTorr, temperature 500° C., alternating current (50 Hz) of 9000 V, in an atmosphere of Argon containing 50% oxygen, under irradiation of ultraviolet light and a thin film of said mixed oxide with a thickness of 1 micron was obtained after 2 hours.

Figure 4:
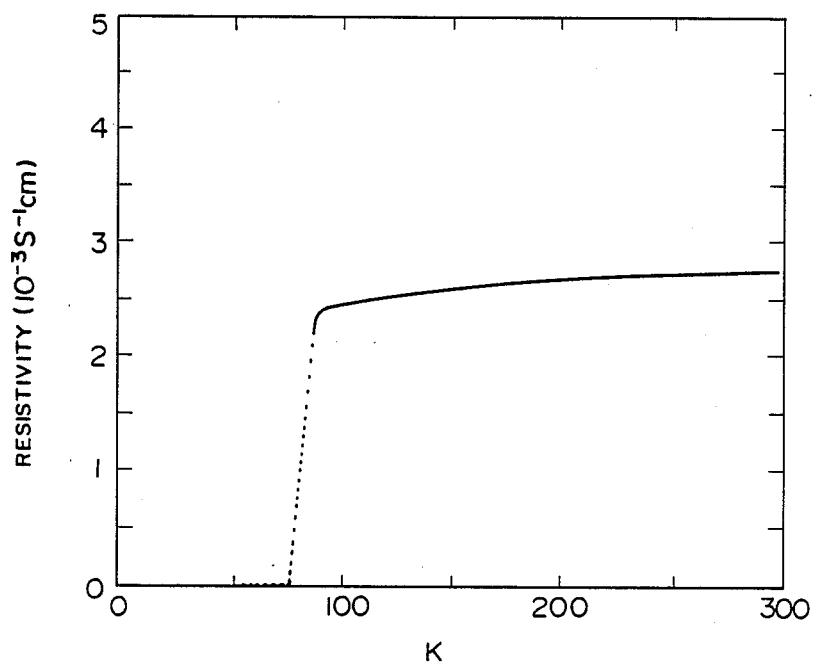
FIG. 4 illustrates the measured value of the resistivity of the thin film of Example 11, using the sputtering apparatus shown in FIG. 3, where the ordinate shows the resistivity ($10^{-3}S^{-1}$cm) and the abscissa shows absolute temperature (K).

The electric resistance of the thin film at low temperature was measured and it was found that the transition to the superconductive state started at a temperature of about 80 K as shown in FIG. 4, becoming superconductive below the limit of measurement at a temperature of about 65 K.

When ultraviolet light of wave length in the range of 110–400 nm was irradiated on the thin film, the conductivity and superconductivity of the thin film was improved. It is thought that the ultraviolet light excited the oxygen atoms in the atmosphere to ozone or oxygen radicals, and these excited ozone or oxygen radicals promoted the intake of the oxygen into the thin film.

We claim:

1. A manufacturing method of a conductive or superconductive thin film which comprises using a mixed oxide composition showing conductivity or superconductivity as a target material and sputtering it on a substrate to form a thin film, then irradiating the thin film with ultraviolet light or vacuum ultraviolet light in an oxygen atmosphere.

2. A manufacturing method of the conductive or superconductive thin film as claimed in claim 4, wherein the thin film is heat-treated after forming.

3. A manufacturing method of a conductive or superconductive thin film which comprises using a mixed oxide composition showing conductivity or superconductivity as a target material and sputtering it on a substrate to form a thin film, wherein the sputtering of the target material is carried out under the radiation of ultraviolet light or vacuum ultraviolet light.

4. A manufacturing method of a conductive or superconductive thin film which comprises using a mixed oxide composition showing conductivity or superconductivity comprising lanthanoid, alkali-earth metal, and copper as main components, as a target material and sputtering it onto a substrate to form a thin film, then irradiating the thin film with ultraviolet light or vacuum ultraviolet light in an oxygen atmosphere.

5. A manufacturing method of a conductive or superconductive thin film which comprises using a mixed oxide composition showing conductivity or superconductivity comprising lanthanoid, alkali-earth metal, and copper as main components, as a target material and sputtering it onto a substrate to form a thin film, wherein the sputtering of the target material is carried out under the radiation of ultraviolet light or vacuum ultraviolet light.

* * * * *